(12) United States Patent
Ozaki

(10) Patent No.: US 7,112,397 B2
(45) Date of Patent: Sep. 26, 2006

(54) IMAGE FORMING COMPOSITION AND PHOTOSENSITIVE LITHOGRAPHIC PLATE USING SAME

(75) Inventor: Jun Ozaki, Warabi (JP)

(73) Assignee: Okamoto Chemical Industry Co., Ltd., Warabi (JP)

( * ) Notice: Subject to any disclaimer, the term of this patent is extended or adjusted under 35 U.S.C. 154(b) by 0 days.

(21) Appl. No.: 10/734,019

(22) Filed: Dec. 11, 2003

(65) Prior Publication Data

US 2004/0131967 A1    Jul. 8, 2004

(30) Foreign Application Priority Data

Jan. 7, 2003    (JP) ............................. 2003-000796

(51) Int. Cl.
  *G03F 7/004*    (2006.01)
  *C07F 7/04*    (2006.01)
(52) U.S. Cl. .................. 430/270.1; 430/302; 430/910; 528/10; 556/438
(58) Field of Classification Search ............ 430/270.1, 430/927; 556/458, 465
  See application file for complete search history.

(56) References Cited

U.S. PATENT DOCUMENTS

| | | | |
|---|---|---|---|
| 5,262,273 A | 11/1993 | Agostino et al. | |
| 2004/0175655 A1 * | 9/2004 | Toyoda et al. ........... | 430/287.1 |

FOREIGN PATENT DOCUMENTS

| | | |
|---|---|---|
| EP | 0 285 025 | 3/1988 |
| EP | 0 146 411 B1 | 7/1991 |
| EP | 0 625 728 A2 | 11/1994 |
| EP | 0 672 954 A2 | 9/1995 |
| EP | 0 823 327 A | 2/1998 |
| JP | 55-057841 | 4/1980 |
| JP | 55-127553 | 10/1980 |
| JP | 60-037549 | 2/1985 |
| JP | 60-198538 A | 10/1985 |
| JP | 07-285275 | 10/1995 |
| JP | 10-268512 | 10/1998 |
| JP | 10-282654 * | 10/1998 |
| JP | 2002-80481 * | 3/2002 |
| JP | 2002-080481 | 3/2002 |
| JP | 2003-292496 * | 10/2003 |
| WO | WO 97/39894 | 10/1997 |

OTHER PUBLICATIONS

CAplus abstract DN 139:292355 of JP 2003-292496, Oct. 2003.*
CAplus abstract DN 136:247695 of JP 2002-080481, Mar. 2002.*
CAplus abstract DN 132:293809 for Yamaguchi et al., Chem. Letters, 2000, 3, 228.*

* cited by examiner

Primary Examiner—Rosemary Ashton
(74) Attorney, Agent, or Firm—Alston & Bird LLP

(57) ABSTRACT

The present invention provides image-forming compositions and photosensitive lithographic plates which are excellent in sensitivity to infrared radiation, latitude of development, treatable area in $m^2$, and printing durability. Specifically, the present invention provides an image-forming composition comprising (A) a polymeric compound obtainable by the addition reaction of a resinous polymer having one or more phenolic hydroxyl groups with a silane coupling agent of the following general formula (1) or (2), (B) an acid generator, (C) an infrared absorber, and (D) an alkali-soluble resin, and a photosensitive lithographic plate having this image-forming composition applied onto a substrate.

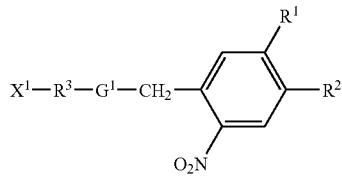

(1)

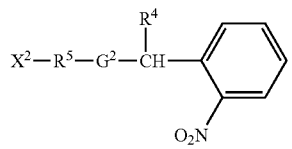

(2)

wherein $X^1$ and $X^2$ each represent a trimethoxysilyl group or the like; $G^1$ represents O or COO; $R^1$ and $R^2$ each independently represents a hydrogen atom or a methoxy group; $R^3$ represents $(CH_2)_m$ which may have a hydrocarbon side chain; $G^2$ represents O or COO; $R^4$ represents a hydrogen atom or a straight-chain or branched alkyl group; and $R^5$ represents $(CH_2)_n$ which may have a hydrocarbon side chain.

4 Claims, No Drawings

IMAGE FORMING COMPOSITION AND PHOTOSENSITIVE LITHOGRAPHIC PLATE USING SAME

BACKGROUND OF THE INVENTION

1. Field of the Invention

This invention relates to image-forming compositions and photosensitive lithographic plates using the same. More particularly, it relates to image-forming compositions for use in positive type lithographic plates which can be directly made on the basis of digital signals from a computer or the like.

2. Description of Related Art

Conventionally, there have been known image-forming materials having a photosensitive layer containing an acid generator and an acid-decomposable compound, as a positive type photosensitive layer which can be solubilized by irradiation with ultraviolet radiation. For example, U.S. Pat. No. 3,779,778 discloses a photosensitive composition containing an acid generator and a water-insoluble compound having a specific acid-decomposable group, Japanese Patent Provisional Publication No. 53-133429/'78 discloses a photosensitive composition containing an acid generator and a compound having an acetal or ketal group in the main chain, and Japanese Patent Provisional Publication No. 60-37549/'85 discloses a photosensitive composition containing an acid generator and a compound having a silyl ether group. However, all of these photosensitive compositions are sensitive to ultraviolet radiation, and are made alkali-soluble by irradiation with ultraviolet radiation to form a non-image area. Consequently, these photosensitive compositions cannot form an image by means of infrared radiation as from an inexpensive and compact semiconductor laser.

As a positive type image-forming technique in which an image can be formed by exposure to infrared radiation as from a semiconductor laser and the exposed region is made soluble in a developing solution, Japanese Patent Provisional Publication Nos. 60-175046/'85 and 7-285275/'95 disclose photosensitive compositions comprising a substance absorbing heat to produce heat (an optothermal conversion substance) and a pyrolyzable compound or alkali-soluble resin. The pyrolyzable compound used therein comprises principally a photosensitive onium salt or a quinoneazide compound. However, these compounds have low pyrolytic efficiency, so that much energy is required to decompose them thermally. Consequently, these photosensitive compositions have the disadvantage of requiring a long treating time because of low sensitivity.

Moreover, Japanese Patent Provisional Publication No. 10-268512/'98 discloses a photosensitive composition comprising an optothermal conversion substance, a dissolution inhibitor and an alkali-soluble resin. However, the dissolution inhibitor comprises a sulfonic acid ester, an aromatic carboxylic acid ester or a quinoneazide compound. Consequently, this photosensitive composition has problems in that the difference in solubility in the developing solution between exposed and unexposed regions, i.e. the stability to the developing solution (latitude of development), is poor and in that the treatable area in m² with the developing solution is small.

SUMMARY OF THE INVENTION

The present invention has been made in consideration of the above-described problems. That is, an object of the present invention is to provide a positive type image-forming composition which has high sensitivity to infrared radiation as from a semiconductor laser, a great difference in solubility in the developing solution between exposed and unexposed regions, i.e. good stability to the developing solution (great latitude of development), a large treatable area in $m^2$ with the developing solution, and high printing durability, as well as a positive type photosensitive lithographic plate using the same.

The above object of the present invention is accomplished by an image-forming composition comprising (A) a polymeric compound obtainable by the addition reaction of a resinous polymer having one or more phenolic hydroxyl groups with a silane coupling agent of the following general formula (1) or (2):

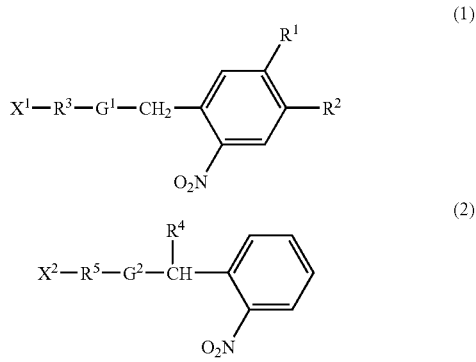

(B) an acid generator;
(C) an infrared absorber; and
(D) an alkali-soluble resin, or a photosensitive lithographic plate having the image-forming composition applied onto a substrate.

In the above general formulae (1) and (2), $X^1$ represents a trimethoxysilyl or triethoxysilyl group; $G^1$ represents O or COO; $R^1$ and $R^2$ each independently represents a hydrogen atom or a methoxy group, but both of them are not hydrogen atoms at the same time; $R^1$ and $R^2$ may also be combined together to form a ring through an alkylenedioxy group; R represents $(CH_2)_m$ which may have a hydrocarbon side chain, wherein m is an integer of 3 or greater, preferably 3 to 15, and more preferably 3 to 10; $X^2$ represents a trimethoxysilyl, triethoxysilyl, chlorodimethylsilyl, dichloromethylsilyl or trichlorosilyl group; $G^2$ represents O or COO; $R^4$ represents a hydrogen atom or a straight-chain or branched alkyl group which is preferably $C_1$ to $C_{10}$ and more preferably $C_1$ to $C_5$; and $R^5$ represents $(CH_2)_n$ which may have a hydrocarbon side chain, wherein n is an integer of 3 or greater, preferably 3 to 15, and more preferably 3 to 10.

According to another aspect of the present invention, there is provided a polymeric compound of the following general formula (I) or (II).

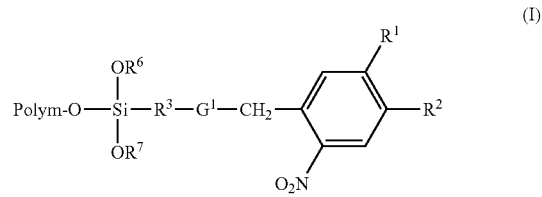

-continued

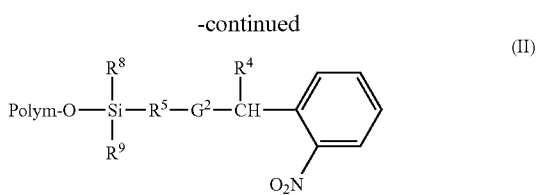

(II)

In the above general formulae (I) and (II), Polym-OH represents a resinous polymer having one or more phenolic hydroxyl groups; $G^1$ represents O or COO; $R^1$ and $R^2$ each independently represents a hydrogen atom or a methoxy group, but both of them are not hydrogen atoms at the same time; $R^1$ and $R^2$ may also be combined together to form a ring through an alkylenedioxy group; $R^3$ represents $(CH_2)_m$ which may have a hydrocarbon side chain, wherein m is an integer of 3 or greater, preferably 3 to 15, and more preferably 3 to 10; $R^6$ and R each independently represents a hydrogen atom, a methyl group or an ethyl group; $G^2$ represents O or COO; $R^4$ represents a hydrogen atom or a straight-chain or branched alkyl group which is preferably $C_1$ to $C_{10}$ and more preferably $C_1$ to $C_5$; $R^5$ represents $(CH_2)_n$ which may have a hydrocarbon side chain, wherein n is an integer of 3 or greater, preferably 3 to 15, and more preferably 3 to 10; and $R^8$ and $R^9$ each independently represents a methyl group, a hydroxyl group or a chlorine atom.

As is evident from the following description, the present invention provides positive type image-forming compositions which contain an acid-decomposable compound having a silyl ether linkage in the material and hence have high sensitivity to infrared radiation as from an inexpensive and compact semiconductor laser, and positive type photosensitive lithographic plates using the same. Moreover, the positive type image-forming compositions of the present invention and the positive type photosensitive lithographic plates using the same exhibit great latitude of development, a large treatable area in m², and excellent printing durability.

DETAILED DESCRIPTION OF PREFERRED EMBODIMENTS

The present invention will be described below in more detail. The image-forming composition and photosensitive lithographic plate in accordance with the present invention comprise (A) a polymeric compound obtainable by the addition reaction of a resinous polymer having one or more phenolic hydroxyl groups with a silane coupling agent of the above general formula (1) or (2) (hereinafter referred to as "acid-decomposable compound"), (B) an acid generator,
(C) an infrared absorber, and
(D) an alkali-soluble resin.

Various components of the image-forming composition of the present invention will be specifically explained below.

According to our findings, it is believed that the acid-decomposable compound of the present invention provides an image-forming composition having excellent characteristics on the basis of the following mechanism. That is, when the image-forming composition is irradiated with infrared radiation as from a semiconductor laser, the infrared absorber absorbs this radiation and instantaneously produces heat, for example, of several hundred degrees. Owing to the heat so produced and the like, the acid generator is decomposed to generate an acid. The acid so generated causes the acid-decomposable compound to decompose at the silyl group and thereby produce a polymer having one or more phenolic hydroxyl groups and a silanol compound. There is a possibility that heat may also contribute to the decomposition of the acid-decomposable compound. The polymer having one or more phenolic hydroxyl groups and the silanol compound, which are produced as a result of the decomposition, are both highly soluble in an alkaline developing solution or the like. On the other hand, owing to the addition of such a polymeric compound, the unexposed region has high alkali resistance and is hardly attacked by the developing solution. Consequently, the acid-decomposable compound of the present invention makes it possible to provide an image-forming composition which exhibits a great difference in solubility in an alkaline developing solution or the like between exposed and unexposed regions, and very excellent stability to the developing solution (great latitude of development). Moreover, the acid-decomposable compound of the present invention gives good ink adhesion and the image-forming composition of the present invention has excellent printing durability.

The acid-decomposable compound used in the present invention can be synthesized by an addition reaction of a resinous polymer having one or more phenolic hydroxyl groups, with a silane coupling agent represented by the above general formula (1) or (2). This reaction is preferably carried out under the following conditions. As the solvent, it is preferable to use hexane, cyclohexane, benzene or the like. The amount of solvent used is preferably in the range of 10 to 200 g per gram of the resinous polymer. The aforesaid silane coupling agent is preferably used in an amount of 0.5 to 100 moles per mole of the hydroxyl groups possessed by the resinous polymer. It is believed that, owing to steric factors and the like, the amount of the silane coupling agent does not depend on the numbers of the reactive groups ($OCH_3$, $OC_2H_5$ and Cl) attached to the silicon. The reaction temperature is preferably in the range of 50 to 150° C. The resulting acid-decomposable compound may be purified, for example, by distilling off the solvent.

The weight-average molecular weight of the acid-decomposable compound is preferably not less than 1,000 and more preferably in the range of 1,500 to 300,000. Generally, the acid-decomposable compound is characterized in that it absorbs ultraviolet radiation having a wavelength, for example, in the range of 200 to 450 nm and it decomposes at $G^1$ or $G^2$.

In this addition reaction of the resinous polymer with the silane coupling agent, the $OCH_3$, $OC_2H_5$ and Cl attached to the silicon in the $X^1$ or $X^2$ of the silane coupling agent are stable in an anhydrous state, but may be hydrolyzed to OH in the presence of water contained naturally in the solvent. As a result of this addition reaction with the silane coupling agent, there is obtained, for example, a compound represented by the following formula (I) or (II). In these formulae, Polym-OH represents a resinous polymer having one or more phenolic hydroxyl groups. $R^6$ and $R^7$ each independently represents a hydrogen atom, a methyl group or an ethyl group, and $R^8$ and $R^9$ each independently represents a methyl group, a hydroxyl group or a chlorine atom.

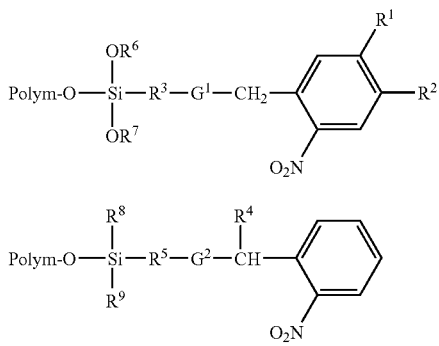

Where the silicon of this silane coupling agent has a plurality of reactive groups (OCH₃, OC₂H₅ or Cl), there is a possibility that the silane coupling agent will react with a plurality of phenolic hydroxyl groups. However, this is thought to be rare. Moreover, the self-condensation of the silane coupling agent is also possible. However, it is believed that this is minimized, for example, by the steric hindrance of the nitro group attached to the benzene ring.

The compounds of the above general formulae (1) and (2) preferably include compounds represented by the following general formulae (1ET), (1ES), (2ET) and (2ES).

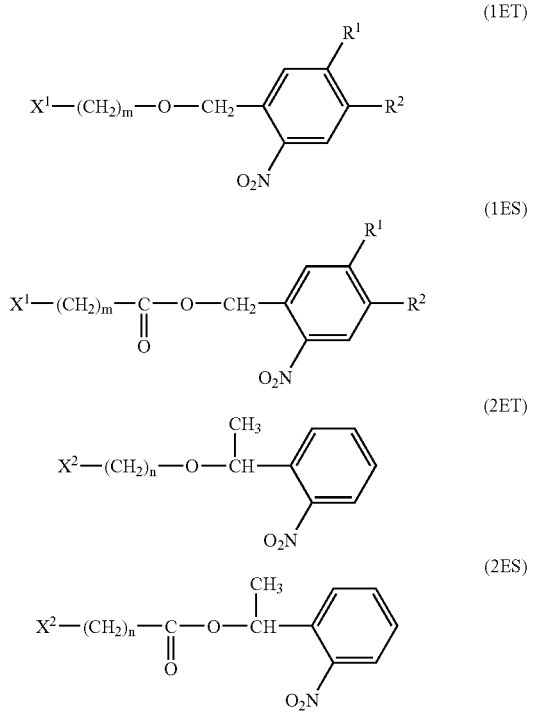

In the above formulae, $X^1$ represents a trimethoxysilyl or triethoxysilyl group; $X^2$ represents a trimethoxysilyl, triethoxysilyl, chlorodimethylsilyl, dichloromethylsilyl or trichlorosilyl group; and m and n each independently represents an integer of 3 or greater m is preferably from 3 to 15 and more preferably from 3 to 10. n is preferably from 3 to 15 and more preferably from 3 to 10. The $(CH_2)_m$ or $(CH_2)_n$ may have one or more hydrocarbon side chains. For the convenience of synthesis, the side chains are preferably located on a carbon atom on the methylene chain that is separated by one or more carbon atoms from the carbon atom to which $X^1$ or $X^2$ is attached. For example, in $X^1-C_a-C_b-C_c-$, $C_c$ is a carbon atom on the methylene chain that is separated by one carbon atom from the carbon atom $C_a$ to which $X^1$ is attached. The size of the hydrocarbon side chains is such that they are preferably $C_3$ to $C_{15}$ and more preferably $C_3$ to $C_{10}$. In the compounds of the general formulae (1ET) and (1ES), $R^1$ and $R^2$ each independently represents a hydrogen atom or a methoxy group, but both of them are not hydrogen atoms at the same time. Alternatively, $R^1$ and $R^2$ may combine together to form a ring through an alkylenedioxy group.

Preferred examples of the compounds of the general formula (1ET) include 2-nitrobenzyl 3-(trimethoxysilyl)propyl ether, 2-nitrobenzyl 6-(trimethoxysilyl)hexyl ether, 2-nitrobenzyl 10-(trimethoxysilyl)decyl ether, 4-methoxy-2-nitrobenzyl 3-(trimethoxysilyl)propyl ether, 4-methoxy-2-nitrobenzyl 6-(trimethoxysilyl)hexyl ether, 4-methoxy-2-nitrobenzyl 10-(trimethoxysilyl)decyl ether, 5-methoxy-2-nitrobenzyl 3-(trimethoxysilyl)propyl ether, 5-methoxy-2-nitrobenzyl 6-(trimethoxysilyl)hexyl ether, 5-methoxy-2-nitrobenzyl 10-(trimethoxysilyl)decyl ether, 4,5-dimethoxy-2-nitrobenzyl 3-(trimethoxysilyl)propyl ether, 4,5-dimethoxy-2-nitrobenzyl 6-(trimethoxysilyl)hexyl ether, 4,5-dimethoxy-2-nitrobenzyl 10-(trimethoxysilyl)decyl ether, 4,5-methylenedioxy-2-nitrobenzyl 3-(trimethoxysilyl) propyl ether, 4,5-methylenedioxy-2-nitrobenzyl 6-(trimethoxysilyl)hexyl ether and 4,5-methylenedioxy-2-nitrobenzyl 10-(trimethoxysilyl)decyl ether. More preferred examples thereof include 4,5-dimethoxy-2-nitrobenzyl 3-(trimethoxysilyl)propyl ether, 4,5-dimethoxy-2-nitrobenzyl 6-(trimethoxysilyl)hexyl ether, 4,5-dimethoxy-2-nitrobenzyl 10-(trimethoxysilyl)decyl ether, 4,5-methylenedioxy-2-nitrobenzyl 3-(trimethoxysilyl)propyl ether, 4,5-methylenedioxy-2-nitrobenzyl 6-(trimethoxysilyl)hexyl ether and 4,5-methylenedioxy-2-nitrobenzyl 10-(trimethoxysilyl)decyl ether.

In the compounds of the general formula (1ET), an example of a group in which $R^1$ and $R^2$ forms a ring is an alkylenedioxy group. Preferred examples thereof include 4,5-methylenedioxy-2-nitrobenzyl 3-(trimethoxysilyl)propyl ether, 4,5-methylenedioxy-2-nitrobenzyl 3-(triethoxysilyl)propyl ether, 4,5-methylenedioxy-2-nitrobenzyl 6-(trimethoxysilyl)hexyl ether, 4,5-methylenedioxy-2-nitrobenzyl 6-(triethoxysilyl)hexyl ether, 4,5-methylenedioxy-2-nitrobenzyl 10-(trimethoxysilyl)decyl ether, 4,5-methylenedioxy-2-nitrobenzyl 10-(triethoxysilyl) decyl ether and the like.

Preferred examples of the compounds of the general formula (2ET) include 3-(chlorodimethylsilyl)propyl 1-(2-nitrophenyl)ethyl ether, 3-(dichloromethylsilyl)propyl 1-(2-nitrophenyl)ethyl ether, 3-(trichlorosilyl)propyl 1-(2-nitrophenyl)ethyl ether, 6-(chlorodimethylsilyl)hexyl 1-(2-nitrophenyl)ethyl ether, 6-(dichloromethylsilyl)hexyl 1-(2-nitrophenyl)ethyl ether, 6-(trichlorosilyl)hexyl 1-(2-nitrophenyl)ethyl ether, 3-(chlorodimethylsilyl)propyl o-nitrobenzyl ether, 3-(dichloromethylsilyl)propyl o-nitrobenzyl ether, 3-(trichlorosilyl)propyl o-nitrobenzyl ether, 6-(chlorodimethylsilyl)hexyl o-nitrobenzyl ether, 6-(dichloromethylsilyl)hexyl o-nitrobenzyl ether, 6-(trichlorosilyl) hexyl o-nitrobenzyl ether, 3-(trimethoxysilyl)propyl 1-(2-nitrophenyl)ethyl ether, 3-(triethoxysilyl)propyl 1-(2-nitrophenyl)ethyl ether, 6-(trimethoxysilyl)hexyl 1-(2-nitrophenyl)ethyl ether, 6-(triethoxysilyl)hexyl 1-(2-nitrophenyl)ethyl ether, 3-(trimethoxysilyl)propyl o-nitrobenzyl ether, 3-(triethoxysilyl)propyl o-nitrobenzyl ether, 6-(trimethoxysilyl)hexyl o-nitrobenzyl ether and 6-(triethoxysilyl)propyl o-nitrobenzyl ether.

Especially preferred examples of the compounds of the general formula (1ES) include 1-(4,5-dimethoxy-2-nitrophenyl)methyl 5-(trimethoxysilyl)pentanoate, 1-(4,5-dimethoxy-2-nitrophenyl)methyl 5-(triethoxysilyl)pentanoate, 1-(4,5-dimethoxy-2-nitrophenyl)methyl 5-(trimethoxysilyl)undecanoate and 1-(4,5-dimethoxy-2-nitrophenyl)methyl 5-(triethoxysilyl)undecanoate.

Especially preferred examples of the compounds of the general formula (2ES) include 1-(2-nitrophenyl)ethyl 5-(chlorodimethylsilyl)pentanoate, 1-(2-nitrophenyl)ethyl 5-(dichloromethylsilyl)pentanoate, 1-(2-nitrophenyl)ethyl 5-(trichlorosilyl)pentanoate, 1-(2-nitrophenyl)ethyl 11-(chlorodimethylsilyl)undecanoate, 1-(2-nitrophenyl)ethyl 11-(dichloromethylsilyl)pentanoate, 1-(2-nitrophenyl)ethyl 11-(trichlorosilyl)undecanoate, o-nitrobenzyl 5-(chlorodimethylsilyl)pentanoate, o-nitrobenzyl 5-(dichloromethylsilyl)pentanoate, o-nitrobenzyl 5-(trichlorosilyl)pentanoate, o-nitrobenzyl 11-(chlorodimethylsilyl)undecanoate, o-nitrobenzyl 11-(dichloromethylsilyl)undecanoate, o-nitrobenzyl 11-(trichlorosilyl)undecanoate, 1-(2-nitrophenyl)ethyl 5-(trimethoxysilyl)pentanoate, 1-(2-nitrophenyl)ethyl 5-(triethoxysilyl)pentanoate, 1-(2-nitrophenyl)ethyl 11-(trimethoxysilyl)undecanoate, 1-(2-nitrophenyl)ethyl 11-(triethoxysilyl)undecanoate, o-nitrobenzyl 5-(trimethoxysilyl)pentanoate, o-nitrobenzyl 5-(triethoxysilyl)pentanoate, o-nitrobenzyl 11-(trimethoxysilyl)undecanoate and o-nitrobenzyl 11-(triethoxysilyl)undecanoate.

The compounds represented by the above general formulae (1ET), (1ES), (2ET) and (2ES) may be synthesized according to the processes described below.

One exemplary process for preparing the compounds of the general formulae (1ET) and (2ET) is shown below.

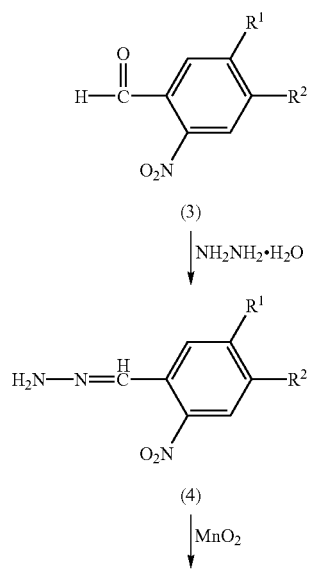

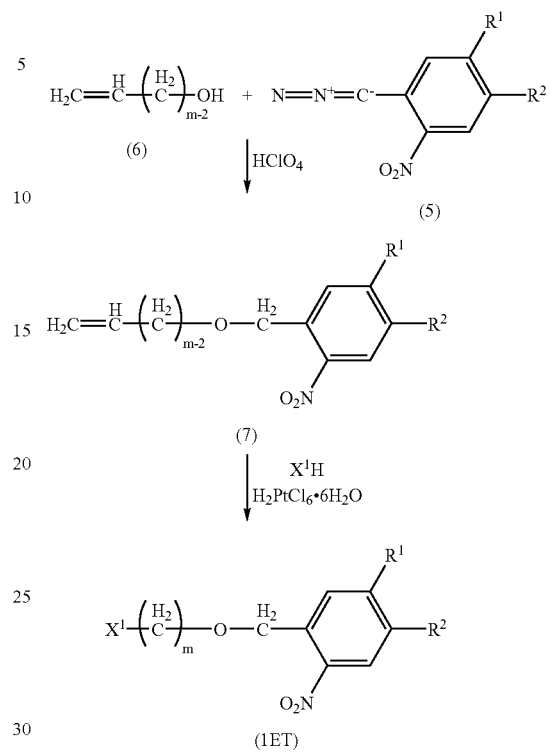

The compounds of the general formula (1ET) are obtained, for example, by reacting 2-nitrobenzaldehyde (3) having $R^1$ and $R^2$ at the 4- and 5-positions with hydrazine, oxidizing the reaction product with manganese dioxide to form a diazo compound (5), reacting it with an alcohol (6) having a double bond in the presence of perchloric acid to form an ether (7), and reacting the double bond of the ether (7) with trimethoxysilane or triethoxysilane under the catalytic action of hydrogen hexachloroplatinate(IV) hexahydrate ($H_2PtCl_6 \cdot 6H_2O$). The compounds of the general formula (2ET) are also obtained in the same manner as above. In order to introduce a chlorodimethylsilyl, dichloromethylsilyl or trichlorosilyl group, the corresponding chlorodimethylsilane, dichloromethylsilane or trichlorosilane may be used.

The preparation of the compounds of the general formulae (1ET) and (2ET) is not limited to this process, but any other well-known processes may be employed. The compounds (1ET) and (2ET) in which $(CH_2)_m$ have hydrocarbon side chains may be synthesized by using a corresponding alcohol.

One exemplary process for preparing the compounds of the general formulae (1ES) and (2ES) is shown below.

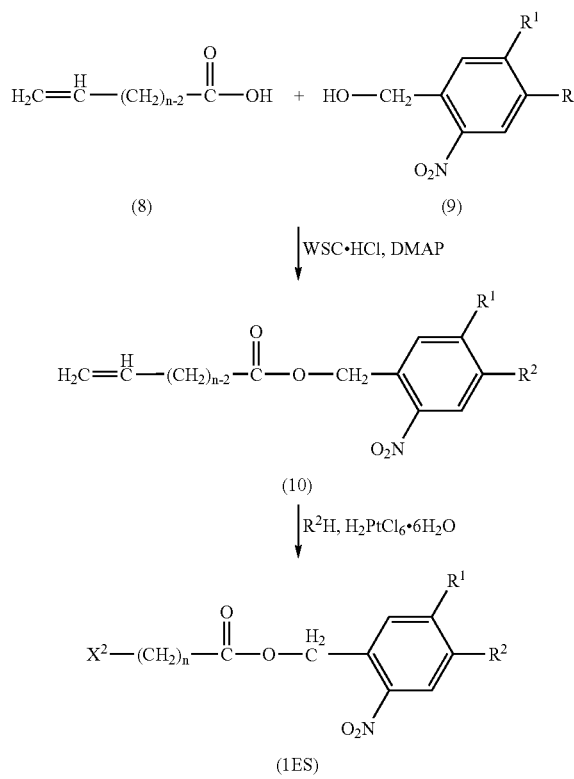

The compounds of the general formula (1ES) are obtained, for example, by reacting a carboxylic acid (8) having a double bond with an o-nitrobenzyl alcohol derivative (9) to form an ester (10), and reacting the double bond with a compound selected from trimethoxysilane, chlorodimethylsilane, dichloromethylsilane and trichlorosilane under the catalytic action of hydrogen hexachloroplatinate (IV) hexahydrate ($H_2PtCl_6 \cdot 6H_2O$). The ester formation is carried out, for example, in the presence of WSC.HCl [WSC is an abbreviation for a water-soluble carbodiimide, and an example of WSC.HCl is 1-ethyl-3-(3-dimethylaminopropyl) carbodiimide hydrochloride] and DMAP (4-dimethylaminopyridine). The ester (10) may also be obtained by converting a carboxylic acid (8) having a double bond into an acid chloride according to a well-known method using thionyl chloride ($SOCl_2$) or the like, and reacting it with an o-nitrobenzyl alcohol derivative (9) in the presence of a tertiary amine such as DMAP.

The compound of the general formula (9) may be synthesized according to a well-known method, for example, by reducing the carbonyl group of a commercially available 2-nitrobenzaldehyde having alkoxy groups at the 4- and 5-positions with sodium boron hydride.

The compounds of the general formula (2ES) may also be synthesized in the same manner as above. In order to introduce a chlorodimethylsilyl, dichloromethylsilyl or trichlorosilyl group, the corresponding chlorodimethylsilane, dichloromethylsilane or trichlorosilane may be used.

The preparation of the ester compounds of the general formulae (1ES) and (2ES) is not limited to this process, but any other well-known processes may be employed. The compounds (1ES) and (2ES) in which $(CH_2)_n$ have a hydrocarbon side chain may be synthesized by using a corresponding alcohol.

The compounds represented by the above general formulae (2ET) and (2ES) may further be synthesized according to the process described in Japanese Patent Provisional Publication No. 2002-80481.

With respect to the aforesaid resinous polymer having one or more phenolic hydroxyl groups, no particular limitation is placed on the positions at which the hydroxyl groups are present, and they may be portions of the side chains. In both cases, the weight-average molecular weight of the resinous polymer is preferably not less than 1,000 and more preferably in the range of 1,500 to 300,000.

Specifically, preferred resinous polymers include cresol-formaldehyde resins [for example, m-cresol-formaldehyde resin, p-cresol-formaldehyde resin, o-cresol-formaldehyde resin, a mixture of m-cresol-formaldehyde resin and p-cresol-formaldehyde resin, mixed phenol/cresol-formaldehyde resins (in which the cresol may be, for example, m-cresol, p-cresol, o-cresol, a mixture of m-cresol and p-cresol, or a mixture of m-cresol and o-cresol), etc.], resol type phenolic resins, pyrogallol-acetone resin, polyvinylphenol, a copolymer of vinylphenol and styrene, t-butyl-substituted polyvinylphenol resin, and the like.

The rate of introduction of a compound of the general formula (1ET), (1ES), (2ET) or (2ES) into the aforesaid resinous polymer is preferably from 5 to 100%. If the rate of introduction is less than 5%, the difference in solubility in the developing solution between exposed and unexposed regions (contrast) may become poor. The term "rate of introduction" means the proportion of hydroxyl groups combined with a compound of formula (1ET) or the like, to all hydroxyl groups possessed by the resinous polymer.

The acid-decomposable compounds which can be used in the present invention may be used alone or in admixture of two or more. The amount of acid-decomposable compound (s) is preferably from 1 to 60% by weight and more preferably from 1.5 to 60% by weight, based on the total solids of the image-forming solution. If the amount added is less than 1% by weight, the difference in solubility in the developing solution between exposed and unexposed region (contrast) may become poor, while if it is greater than 60% by weight, the sensitivity may be reduced.

The acid generator used in the present invention is a compound which can generate an acid when the composition of the present invention is irradiated with near infrared or infrared radiation. There may be used various well-known compounds commonly used as acid generators, and mixtures thereof. Preferred acid generators include, for example, the $BF_4^-$, $PF_6^-$, $SbF_6^-$, $SiF_6^{2-}$ and $ClO_4^-$ salts of diazonium, phosphonium, sulfonium and iodonium.

Other usable acid generators are organic halogen compounds. Organic halogen compounds are preferred from the viewpoint of the sensitivity of image formation by exposure to near infrared and infrared radiation, and the shelf life of the image-forming composition. Among such organic halogen compounds, triazines having a halogen-substituted alkyl group and oxadiazoles having a halogen-substituted alkyl group are preferred, and s-triazines having a halogen-substituted alkyl group are especially preferred. Specific examples thereof include 2-(p-methoxyphenyl)-4,6-bis(trichloromethyl)-s-triazine, 2-(p-methoxynaphthyl)-4,6-bis(trichloromethyl)-s-triazine and 2-(p-methoxystyryl)-4,6-bis(trichloromethyl)-s-triazine.

In the present invention, the amount of the acid generator added is preferably from 0.1 to 20% by weight and more preferably from 0.2 to 10% by weight, based on the total solids of the image-forming composition. If the amount added is less than 0.1% by weight, the sensitivity will be reduced, while if it is greater than 20% by weight, the image-forming composition will become hardly soluble in the solvent used for the dissolution thereof.

The infrared absorber contained in the photosensitive layer is a substance having a optothermal conversion function in which heat is produced by irradiation with near infrared or infrared radiation (radiation preferably having wavelengths in the range of 700 to 2,500 nm and more preferably in the range of 700 to 1,300 nm). The infrared absorber is used to decompose the acid generator rapidly with the aid of heat produced thereby and facilitate the generation of an acid. The infrared absorbers which can be used in the present invention include infrared-absorbing dyes absorbing light at a wavelength of 700 nm or greater, carbon black, magnetic powders and the like. Especially preferred infrared absorbers are infrared-absorbing dyes having an absorption peak at a wavelength of 700 to 850 nm and a molar extinction coefficient ($\epsilon$) of not less than $10^5$ at the peak.

As the aforesaid infrared-absorbing dyes, cyanine dyes, squalium dyes, croconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes, intermolecular CT dyes and the like are preferred.

These dyes may be synthesized according to well-known methods. Alternatively, the following commercial products may also be used.

Nippon Kayaku Co., Ltd.: IR750 (anthraquinone dye), IR002, IR003 (aluminum dyes), IR820 (polymethine dye), IRG022, IRG033 (diimmonium dyes), CY-2, CY-4, CY-9, CY-10, CY-20.

Dainippon Ink and Chemicals, Incorporated: Fastogen blue 8120.

Midori Kagaku Co., Ltd.: MIR-101, 1011, 1021.

The aforesaid dyes are also sold by other suppliers including Nippon Kanko Shikiso Kenkyujo, Ltd., Sumitomo Chemical Co., Ltd. and Fuji Photo Film Co., Ltd.

In the present invention the amount of infrared absorbed added is preferably from 0.5 to 5% by weight and more preferably from 0.6 to 4.5% by weight, based on the total solids of the image-forming composition. If the amount added is less than 0.5% by weight, the sensitivity will be reduced, while if it is greater than 5% by weight, the developability of the non-image area (exposed region) will be reduced.

It is desirable that the alkali-soluble resin used in the present invention has solubility and swellability in alkaline solutions. Such polymeric compounds include, for example, polyamides, polyethers, polyesters, polycarbonates, polystyrene, polyurethanes, polyvinyl butyral resin, novolak resins and acrylic resins.

Preferred examples of the aforesaid novolak resins include phenol-formaldehyde resin, cresol novolak resin, cresol-formaldehyde resin, phenol-cresol-formaldehyde copolycondensate resin (see Japanese Patent Provisional Publication No. 55-57841/'80), and p-substituted phenol/phenol or cresol/formaldehyde copolycondensate resin (see Japanese Patent Provisional Publication No. 55-127553/'80).

Moreover, alkali-soluble acrylic copolymers formed by the copolymerization of monomers selected from the following classes (1) to (8) and having one or more phenolic hydroxyl groups may also be used as alkali-soluble resins.

(1) Monomers having a phenolic hydroxyl group. They include, for example, N-(4-hydroxyphenyl)acrylamide, N-(4-hydroxyphenyl)methacrylamide, N-(p-hydroxyphenyl)maleimide, p-isopropenylphenol, o-hydroxystyrene, m-hydroxystyrene, p-hydroxystyrene, o-hydroxyphenyl acrylate, m-hydroxyphenyl acrylate, p-hydroxyphenyl acrylate, o-hydroxyphenyl methacrylate, m-hydroxyphenyl methacrylate and p-hydroxyphenyl methacrylate.

(2) Monomers having an aliphatic hydroxyl group. They include, for example, 2-hydroxyethyl acrylate, 2-hydroxyethyl methacrylate, 2-hydroxy-3-phenoxypropyl acrylate and 2-hydroxy-3-phenoxypropyl methacrylate.

(3) $\alpha,\beta$-unsaturated carboxylic acids. They include, for example, acrylic acid, methacrylic acid and maleic anhydride.

(4) Monomers having an allyl group. They include, for example, allyl methacrylate and N-allylmethacrylamide.

(5) Alkyl acrylates and alkyl methacrylates. They include, for example, methyl acrylate, ethyl acrylate, propyl acrylate, butyl acrylate, amyl acrylate, hexyl acrylate, octyl acrylate, lauryl acrylate, glycidyl acrylate, methyl methacrylate, ethyl methacrylate, propyl methacrylate, butyl methacrylate, amyl methacrylate, hexyl methacrylate, octyl methacrylate, lauryl methacrylate and glycidyl methacrylate.

(6) Acrylamides and methacrylamides. They include, for example, acrylamide, N-methylolacrylamide, N-ethylacrylamide, N-hexylacrylamide, N-cyclohexylacrylamide, N-hydroxyethylacrylamide, N-phenylacrylamide, methacrylamide, N-methylolmethacrylamide, N-ethylmethacrylamide, N-hexylmethacrylamide, N-cyclohexylmethacrylamide, N-hydroxyethylmethacrylamide and N-phenylmethacrylamide.

(7) Styrenes. They include, for example, styrene, $\alpha$-methylstyrene and chloromethylstyrene.

(8) N-Vinylpyrrolidone, N-vinylcarbazole, 4-vinylpyridine, acrylonitrile, methacrylonitrile and the like.

Furthermore, the aforesaid alkali-soluble resins may be copolymers formed by copolymerizing monomers as described above, together with other monomers copolymerizable therewith. The aforesaid alkali-soluble resins may also be copolymers which are formed by the copolymerization of monomers as described above and further modified, for example, with glycidyl methacrylate or the like.

In the present invention, the aforesaid alkali-soluble resins may be used alone or in admixture of two or more. They are preferably added in an amount of 20 to 99% by weight and more preferably 25 to 98% by weight, based on the total solids of the image-forming composition. If the amount added is less than 20% by weight, the printing durability may be reduced, while if it is greater than 99% by weight, the sensitivity may be reduced.

In the alkali-soluble resin used in the present invention, it is more preferable from the viewpoint of latitude of development to use a mixture of a novolak resin and an alkali-soluble acrylic copolymer as described above. The amount of acrylic copolymer added is preferably from 5 to 40% by weight and more preferably from 6 to 35% by weight, based on the novolak resin. If the amount added is less than 5% by weight, the latitude of development may become poor, while if it is greater than 40% by weight, the printing durability may be reduced.

In order to color the image-forming composition of the present invention, dyes may be added thereto. As such dyes, oil-soluble dyes and basic dyes are preferred. Specifically, Crystal Violet, Malachite Green, Victoria Blue, Methylene Blue, Ethyl Violet, Rhodamine B, Victoria Pure Blue BOH (manufactured by Hodogaya Chemical Co., Ltd.), Oil Blue 613 (manufactured by Orient Chemical Industries, Ltd.), Oil Green and the like are preferred. These dyes are preferably added in an amount of 0.05 to 5.0% by weight and more preferably 0.1 to 4.0% by weight, based on the total solids of the image-forming composition. If the amount added is less than 0.1% by weight, the image-forming layer may not be sufficiently colored to make the images clearly visible, while if it is greater than 5.0% by weight, the dye(s) will undesirably tend to remain in the non-image area after development.

Moreover, a lipophilic resin may be added to the photosensitive layer formed by the image-forming composition of the present invention in order to improve the lipophilicity of the photosensitive layer.

As the aforesaid lipophilic resin, there may be used, for example, a condensation product formed from a phenol substituted with one or more alkyl groups of $C_3$ to $C_{15}$ and an aldehyde, as described in Japanese Patent Provisional Publication No. 50-125806/'75; or a t-butylphenol-formaldehyde resin.

Moreover, in order to enhance its sensitivity, the image-forming composition of the present invention may further comprise a phenol, an organic acid or a leucopigment as required. Preferred phenols includes bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3",5"-tetramethyltriphenylmethane and the like.

Preferred organic acids include sulfonic acids, sulfinic acids, alkylsulfuric acids, phosphonic acids, phosphoric esters, carboxylic acids and the like, as described in Japanese Patent Provisional Publication No. 60-88942/'85, Japanese Patent Provisional Publication No. 2-96755/'90 and the like. Specifically, they include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, toluylic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid and the like.

Preferred leucopigments include 3,3-bis(4-dimethylaminophenyl)-6-dimethylaminophthalide, 3-(4-diethylamino-2-ethoxyphenyl)-3-(1-ethyl-2-methylindol-3-yl)-4-azaphthalide, 3-(4-diethylaminophenyl)-3-(1-ethyl-2-methylindol-3-yl)phthalide, 3,3-bis(4-diethylamino-2-ethoxyphenyl)-4-azaphthalide, 3,6,6'-tris(dimethylamino)spiro[fluorene-9,3'-phthalide], 3,3-bis(1-n-butyl-2-methylindol-3-yl)phthalide and the like.

The aforesaid phenol, organic acid or leucopigment is preferably present in an amount of 0.05 to 20% by weight, more preferably 0.1 to 15% by weight, and most preferably 0.1 to 10% by weight, based on the total solids of the image-forming composition.

Furthermore, in order to expand its treating stability to developing conditions, a nonionic surface-active agent as described in Japanese Patent Provisional Publication Nos. 62-251740/'87 and 3-208514/'91, or an amphoteric surface-active agent as described in Japanese Patent Provisional Publication Nos. 59-121044/'84 and 4-13149/'92 may be added to the image-forming composition of the present invention. Suitable examples of the nonionic surface-active agent include sorbitan tristearate, sorbitan monopalmitate, sorbitan trioleate, stearic acid monoglyceride, polyoxyethylene nonylphenyl ether and the like. Suitable examples of the amphoteric surface-active agent include alkyldi(aminoethyl)glycine, alkylpolyaminoethylglycine hydrochloride, 2-alkyl-N-carboxyethyl-N-hydroxyethylimidazolinium betaine, N-tetradecyl-N,N-betaine type surface-active agents (e.g., the one commercially available from Dai-ichi Kogyo Seiyaku Co., Ltd. under the trade name of "Amogen K") and the like. The aforesaid nonionic surface-active agent or amphoteric surface-active agent is preferably present in an amount of 0.05 to 15% by weight and more preferably 0.1 to 15% by weight, based on the total solids of the image-forming material.

A photosensitive lithographic plate in accordance with the present invention can be made by dissolving the various components of the aforesaid image-forming composition in a suitable solvent, applying the resulting solution onto a substrate, and drying it. For this purpose, the concentration of the image-forming material is preferably from 1 to 50% by weight and more preferably from 5 to 30% by weight.

Preferred examples of the aforesaid solvent include methanol, ethanol, propanol, methylene chloride, ethyl acetate, tetrahydrofuran, propylene glycol monomethyl ether, propylene glycol monoethyl ether, methyl cellosolve, methyl cellosolve acetate, dimethylformamide, dimethyl sulfoxide, dioxane, acetone, cyclohexanone, trichloroethylene and methyl ethyl ketone. These solvents may be used alone or in admixture of two or more.

The application of the solvent containing the aforesaid image-forming composition onto a substrate may be carried out according to any of conventionally known techniques including, for example, spin coating, extrusion coating, wire bar coating, roll coating, air knife coating, dip coating and curtain coating. The amount applied is preferably from 0.5 to 5.0 g/m² on a solid basis, though it may vary with the end use.

Examples of the aforesaid substrate include metal plates formed of aluminum, zinc, copper, steel or the like; metal plates coated with chromium, zinc, copper, nickel, aluminum, iron or the like by electroplating or vapor deposition; paper, plastic films and glass plates; resin-coated paper; and hydrophilized plastic films.

When the present invention is applied to a photosensitive lithographic plate, it is especially preferable to use, as the aforesaid substrate, an aluminum plate gained with a brush or balls, an aluminum plate grained with a brush and then anodized, an aluminum plate electrolytically grained and then anodized, or an aluminum plate treated by a combination thereof.

The aluminum plate pretreated in the above-described manner may further be subjected to after-treatments including, for example, chemical conversion treatment with a solution containing an alkali metal silicate, sodium phosphate, sodium fluoride, zirconium fluoride, alkyl titanate, trihydroxybenzoic acid or a mixture thereof, sealing treatment by dipping into a hot aqueous solution or with a steam bath; coating treatment with an aqueous solution of strontium acetate, zinc acetate, magnesium acetate or calcium benzoate; and front or rear surface coating treatment with polyvinyl pyrrolidone, polyaminesulfonic acid, polyvinylphosphonic acid, polyacrylic acid or polymethacrylic acid.

Furthermore, an aluminum or other substrate which has been subjected to a surface treatment as described in Japanese Patent Provisional Publication No. 10-297130/'98 can also be used as the aforesaid substrate.

As the laser light source used to irradiate the image-forming composition of the present invention with actinic radiation, light from a solid-state or semiconductor laser having an oscillation wavelength in the near infrared to infrared region is preferred.

As the developing solution used to develop the image-forming composition of the present invention, an aqueous alkaline developing solution is preferred. Examples of the aqueous alkaline developing solution include aqueous solutions of alkali metal salts such as sodium hydroxide, potassium hydroxide, sodium carbonate, potassium carbonate, sodium silicate, potassium silicate, sodium metasilicate, potassium metasilicate, sodium secondary phosphate and sodium tertiary phosphate.

Moreover, an activator may be added to the aforesaid aqueous alkaline solutions. As the aforesaid activator, there may be used an anionic surface-active agent or an amphoteric surface-active agent may be used.

Usable examples of the aforesaid anionic surface-active agent include sulfuric esters of alcohols of $C_8$ to $C_{22}$ (e.g., polyoxyethylene alkylsulfate sodium salt), alkylarylsulfonic acid salts (e.g., sodium dodecylbenzenesulfonate, polyoxyethylene dodecylphenylsulfate sodium salt, sodium alkylnaphthalenesulfonate, sodium naphthalenesulfonate, and formalin condensate of sodium naphthalenesulfonate), sodium dialkylsulfoxylates, alkyl ether phosphoric esters and alkyl phosphates. Preferred examples of the amphoteric surface-active agent include alkylbetaine type and alkylimidazoline type surface-active agents. Furthermore, a water-soluble sulfurous acid salt such as sodium sulfite, potassium sulfite, lithium sulfite or magnesium sulfite may also be added to the aforesaid aqueous alkaline solutions.

EXAMPLES

The present invention is further illustrated by the following examples. However, these examples are not to be construed to limit the scope of the invention.

Synthesis of 2-nitrobenzyl 6-(trimethoxysilyl)hexyl ether

A 20-ml eggplant type flask was purged with nitrogen, and charged with 2.5 g (10.7 mmol) of 5-hexenyl 2-nitrobenzyl ether, 1.56 g (12.8 mmol) of trimethoxysilane, and an infinitesimal amount of hydrogen hexachloroplatinate(IV) hexahydrate ($H_2PtCl_6 \cdot 6H_2O$), followed by stirring at 37° C. for 30 minutes. Thereafter, the bath temperature was raised to 100° C., and the reaction was completed in 2 hours. After the temperature was returned to room temperature, the reaction mixture was purified by vacuum distillation using a short path. From the second fraction (0.2 mmHg/123–125° C.), 1.98 g of the desired product was obtained in a 52% yield.

$^1$H NMR (400 MHz, $CDCl_3$/TMS): δ 7.4–8.1 (m, 4H, Ar), 4.9 (s, 2H, Ar—$CH_2$—O—), 3.6 (s, 9H, —Si($OCH_3$)$_3$), 3.6 (t, 2H, —O—$CH_2$—$CH_2$—), 1.7 (m, 2H, —$CH_2$—), 1.4 (m, 6H, —($CH_2$)$_3$—), 0.7 (t, 2H, —$CH_2$—Si—). FT-IR (NaCl): 2935 cm$^{-1}$ (C—H), 2844 (C—H), 1528 ($NO_2$), 1344 ($NO_2$), 1191 (C—O—C).

Synthesis of 4,5-dimethoxy-2-nitrobenzyl 6-(trimethoxysilyl)hexyl ether

A 20-ml eggplant type flask was purged with nitrogen, and charged with 2.95 g (10.0 mmol) of 5-hexenyl 4,5-dimethoxy-2-nitrobenzyl ether, 1.47 g (12 mmol) of trimethoxysilane, and an infinitesimal amount of hydrogen hexachloroplatinate(IV) hexahydrate ($H_2PtCl_6 \cdot 6H_2O$), followed by stirring at 37° C. for 30 minutes. Thereafter, the bath temperature was raised to 100° C., and the reaction was completed in 2 hours. The reaction mixture was purified by silica gel column chromatography using a medium-pressure column. Using a mixture of hexane, ethyl acetate and tetramethoxysilane (in a volume ratio of 100:20:1) as the eluent, 1.4 g (3.35 mmol) of the desired product was obtained in a 34% yield. Its $R_f$ value (for the aforesaid eluent) was 0.1.

$^1$H NMR (400 MHz, $CDCl_3$/TMS): δ 7.71 (s, 1H, Ar), 7.31 (s, 1H, Ar), 4.89 (s, 2H, Ar—$CH_2$—O—), 4.96–3.99 (s, 6H, Ar—$OCH_3$), 3.58–3.61 (s, 2H, —O—$CH_2$—$CH_2$—), 3.57 (s, 9H, —Si($OCH_3$)$_3$), 1.4–1.7 (m, 8H, —$CH_2$—($CH_2$)$_4$—$CH_2$—), 0.63–0.67 (m, 2H, —$CH_2$—Si—). FT-IR (NaCl): 2936 cm$^{-1}$ (C—H), 2843 (C—H), 1520 ($NO_2$), 1328 ($NO_2$), 1276 (C—O—C).

Synthesis of 4,5-methylenedioxy-2-nitrobenzyl 3-(trimethoxysilyl)propyl ether

A 10-ml eggplant type flask was purged with nitrogen, and charged with 1.0 g (4.2 mmol) of allyl 3,4-methylenedioxy-6-nitrobenzyl ether, 0.616 g (5 mmol) of trimethoxysilane, and an infinitesimal amount of hydrogen hexachloroplatinate(IV) hexahydrate ($H_2PtCl_6 \cdot 6H_2O$), followed by stirring at 37° C. for 30 minutes. Thereafter, the bath temperature was raised to 100° C., and the reaction was completed in 2 hours. The reaction mixture was purified by silica gel column chromatography using a medium-pressure column. Using a mixture of hexane, ethyl acetate and tetramethoxysilane (in a volume ratio of 100:20: 1) as the eluent, 0.80 g (2.2 mmol) of the desired product was obtained in a 52% yield. Its $R_f$ value (for the aforesaid eluent) was 0.1.

$^1$H NMR (400 MHz, $CDCl_3$/TMS): δ 7.61 (s, 1H, Ar), 7.29 (s, 1H, Ar), 6.14 (s, 2H, —O—$CH_2$—O—), 4.83 (s, 2H, Ar—$CH_2$—O—), 3.51–3.65 (m, 2H, —O—$CH_2$—$CH_2$—), 3.58 (s, 9H, —Si—($OCH_3$)$_3$), 1.75–1.83 (m, 2H, —$CH_2$—$CH_2$—$CH_2$—), 0.70–0.77 (m, 2H, —$CH_2$—Si—). FT-IR (NaCl): 2941 cm$^{-1}$ (C—H), 2842 (C—H), 1522 ($NO_2$), 1324 ($NO_2$), 1260 (C—O—C).

Synthesis of 4,5-dimethoxy-2-nitrobenzyl 3-(trimethoxysilyl)propyl ether

A 30-ml eggplant type flask was purged with nitrogen, and charged with 1.5 g (5.9 mmol) of allyl 4,5-dimethoxy-2-nitrobenzyl ether, 0.865 g (7.1 mmol) of trimethoxysilane, and an infinitesimal amount of hydrogen hexachloroplatinate(IV) hexahydrate ($H_2PtCl_6 \cdot 6H_2O$), followed by stirring at 37° C. for 30 minutes. Thereafter, the bath temperature was raised to 100° C., and the reaction was completed in 2 hours. The reaction mixture was purified by silica gel column chromatography using a medium-pressure column. Using a mixture of hexane, ethyl acetate and tetramethoxysilane (in a volume ratio of 100:20:1) as the eluent, 0.95 g (2.53 mmol) of the desired product was obtained in a 43% yield. Its $R_f$ value (for the aforesaid eluent) was 0.19.

$^1$H NMR (400 MHz, $CDCl_3$/TMS): δ 7.71 (s, 1H, Ar), 7.33 (s, 1H, Ar), 4.90 (s, 2H, Ar—$CH_2$—O—), 3.95–4.00 (s, 6H, Ar—$CH_2$—O—), 3.58–3.63 (s, 2H, —O—$CH_2$—$CH_2$—), 3.57 (s, 9H, —Si—($OCH_3$)$_3$), 1.6–1.8 (m, 2H, —$CH_2$—$CH_2$—$CH_2$—), 0.72–0.76 (m, 2H, —$CH_2$—Si—). FT-IR (NaCl): 2941 cm$^{-1}$ (C—H), 2843 (C—H), 1520 ($NO_2$), 1328 ($NO_2$), 1275 (C—O—C).

Synthesis of an Acid-decomposable Compound ①

Maruka Linker CST70 (vinylphenol:styrene=7:3) (manufactured by Maruzen Petrochemical Co., Ltd.) (0.215 g) as a resinous polymer containing phenolic hydroxyl groups, and 2-nitrobenzyl 6-(trimethoxysilyl)hexyl ether (0.45 g; 100% theoretical introduction rate) as a silane coupling agent were mixed in hexane (6 ml) and heated at 70° C. for 1 hour with stirring. Thereafter, the hexane was distilled off to obtain an acid-decomposable compound ①.

In its IR spectrum, a new peak attributable to —Si—O— appeared. Thus, it was confirmed that the desired reaction had been effected. The term "100% theoretical introduction rate" means that the amount of the silane coupling agent is stoichiometrically equivalent to the hydroxyl groups possessed by the polymer.

Synthesis of an Acid-decomposable Compound ②

A pyrogallol-acetone resin (0.173 g) as a resinous polymer containing phenolic hydroxyl groups, and 4,5-dimethoxy-2-nitrobenzyl 6-(trimethoxysilyl)hexyl ether (0.52 g; 100% theoretical introduction rate) as a silane coupling agent were mixed in hexane (6 ml) and heated at 70° C. for 1 hour with stirring. Thereafter, the hexane was distilled off to obtain an acid-decomposable compound ②. An assignment was made in the same manner as in the synthesis of acid-decomposable compound ①.

Synthesis of an Acid-decomposable Compound ③

Maruka Linker CST50 (vinylphenol:styrene=5:5) (manufactured by Maruzen Petrochemical Co., Ltd.) (0.215 g) as a resinous polymer containing phenolic hydroxyl groups, and 4,5-methylenedioxy-2-nitrobenzyl 3-(trimethoxysilyl) propyl ether (0.34 g; 100% theoretical introduction rate) as a silane coupling agent were mixed in hexane (6 ml) and heated at 70° C. for 1 hour with stirring. Thereafter, the hexane was distilled off to obtain an acid-decomposable compound ③. An assignment was made in the same manner as in the synthesis of acid-decomposable compound ①.

Synthesis of an Acid-decomposable Compound ④

A cresol novolak resin (0.146 g) as a resinous polymer containing phenolic hydroxyl groups, and 4,5-dimethoxy-2-nitrobenzyl 3-(trimethoxysilyl)propyl ether (0.47 g; 100% theoretical introduction rate) as a silane coupling agent were mixed in hexane (6 ml) and heated at 70° C. for 1 hour with stirring. Thereafter, the hexane was distilled off to obtain an acid-decomposable compound ④. An assignment was made in the same manner as in the synthesis of acid-decomposable compound ①.

Synthesis of a Control Acid-decomposable Compound ⑤

Maruka Linker CST70 (vinylphenol:styrene=7:3) (manufactured by Maruzen Petrochemical Co., Ltd.) (0.215 g) as a resinous polymer containing phenolic hydroxyl groups, and trimethoxysilane (0.153 g; 100% theoretical introduction rate) as a silane coupling agent were mixed in hexane (6 mL) and heated at 70° C. for 1 hour with stirring. Thereafter, the hexane was distilled off to obtain an acid-decomposable compound ⑤. An assignment was made in the same manner as in the synthesis of acid-decomposable compound ①.

Synthesis of a Control Acid-decomposable Compound ⑥

Maruka Linker CST70 (vinylphenol:styrene=7:3) (manufactured by Maruzen Petrochemical Co., Ltd.) (0.215 g) as a resinous polymer containing phenolic hydroxyl groups, and trimethoxy-n-propylsilane (0.205 g; 100% theoretical introduction rate) as a silane coupling agent were mixed in hexane (6 mL) and heated at 70° C. for 1 hour with stirring. Thereafter, the hexane was distilled off to obtain an acid-decomposable compound ⑥. An assignment was made in the same manner as in the synthesis of acid-decomposable compound ①.

Synthesis of a Control Acid-decomposable Compound ⑦

Maruka Linker CST70 (vinylphenol:styrene=7:3) (manufactured by Maruzen Petrochemical Co., Ltd.) (0.215 g) as a resinous polymer containing phenolic hydroxyl groups, and phenyltrimethoxysilane (0.25 g; 100% theoretical introduction rate) as a silane coupling agent were mixed in hexane (6 mL) and heated at 70° C. for 1 hour with stirring. Thereafter, the hexane was distilled off to obtain an acid-decomposable compound ⑦. An assignment was made in the same manner as in the synthesis of acid-decomposable compound ①.

Synthesis of an Alkali-soluble Acrylic Copolymer ①

A 500-ml four-neck flask fitted with a stirrer and a cooling pipe was charged with reagent A [18.7 g of N-(p-hydroxyphenyl)maleimide, 17.2 g of acrylonitrile, 5 g of methyl methacrylate, 6.5 g of 2-hydroxyethyl methacrylate and 108 g of dimethylacetamide] and purged with nitrogen for about 20 minutes. Then, after the flask was heated to 73° C. in an oil bath, reagent B [0.25 g of 2,2'-azobis(2-methylbutyronitrile)] was added thereto and the resulting reaction mixture was stirred for 2 hours. Furthermore, reagent C [a mixture of 18.7 g of N-(p-hydroxyphenyl)maleimide, 17.2 g of acrylonitrile, 5 g of methyl methacrylate, 6.5 g of 2-hydroxyethyl methacrylate and 108 g of dimethylacetamide, and 0.25 g of 2,2'-azobis(2-methylbutyronitrile)] was added dropwise thereto through a dropping funnel over a period of 2 hours. After completion of the addition, the stirring was continued at 73° C. for an additional 2 hours to obtain an alkali-soluble resin ⑨ having a concentration of 30% by weight.

Synthesis of an Alkali-soluble Acrylic Copolymer ②

A 500-ml four-neck flask fitted with a stirrer and a cooling pipe was charged with reagent A [9.4 g of N-(p-hydroxyphenyl)maleimide, 15.9 g of acrylonitrile, 5 g of methyl methacrylate, 12.1 g of 2-(O-[1'-methylpropylideneamino] carboxyamino)ethyl methacrylate, 4.3 g of methacrylic acid and 109 g of dimethylacetamide] and purged with nitrogen for about 20 minutes. Then, after the flask was heated to 73° C. in an oil bath, reagent B [0.25 g of 2,2'-azobis(2-methylbutyronitrile)] was added thereto and the resulting reaction mixture was stirred for 2 hours. Furthermore, reagent C [a mixture of 9.4 g of N-(p-hydroxyphenyl)maleimide, 15.9 g of acrylonitrile, 5 g of methyl methacrylate, 12.1 g of 2-(O-[1'-methylpropylideneamino]carboxyamino)ethyl methacrylate, 4.3 g of methacrylic acid and 109 g of dimethylacetamide, and 0.25 g of 2,2'-azobis(2-methylbutyronitrile)] was added dropwise thereto through a dropping funnel over a period of 2 hours. After completion of the addition, the stirring was continued at 73° C. for an additional 2 hours to obtain an alkali-soluble resin ② having a concentration of 30% by weight.

A substrate was prepared as follows. After a 0.24 mm thick aluminum plate (material 1050) was degreased with alkali, its surface was grained with a nylon brush under a flowing aqueous suspension of pumice powder, and washed thoroughly with water. Then, a 15 wt. % aqueous solution of sodium hydroxide at 70° C. was poured thereonto for 5 seconds, so that its surface was etched by an amount of 3 g/m². After further washing with water, its surface was electrolytically roughened at 200 coulombs/dm² in a 1N hydrochloric acid bath. After subsequent washing with water, its surface was etched again with a 15 wt. % aqueous solution of sodium hydroxide, washed with water, and desmutted by soaking in a 20 wt. % aqueous solution of nitric acid. Then, the plate was anodized in a 15 wt. % aqueous solution of sulfuric acid to form a 1.8 g/m² oxide film. After washing with water, the plate was post-treated with a 2 wt. % potassium fluoride solution at 50° C., washed with water, and dried.

EXAMPLE 1

Using a whirler, the following sensitizing solution 1 was applied onto the aforesaid aluminum substrate so as to give a dry film thickness of 1.8 g/m², and dried at 100° C. for 10 minutes to obtain a lithographic plate.

(Sensitizing Solution 1)
Acid-decomposable compound ① (0.215 g)
Acid generator: 2-(p-methoxyphenyl)-4,6-bis(trichloromethyl)-s-triazine (0.021 g)
Infrared absorber: cyanine compound A shown below (0.072 g)
Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ① (1.0 g)
Dye: Crystal Violet (0.01 g)
Solvent: propylene glycol monomethyl ether/methyl cellosolve acetate (45 ml/5 ml)

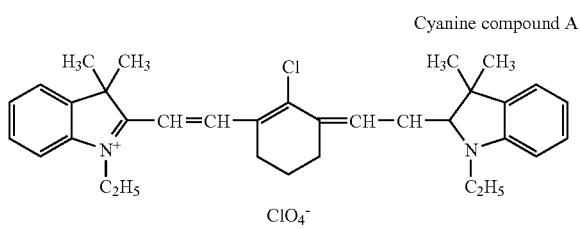

Cyanine compound A

EXAMPLE 2

Using a whirler, the following sensitizing solution 2 was applied onto the same substrate as used in Example 1, so as to give a dry film thickness of 1.8 g/m², and dried at 100° C. for 10 minutes to obtain a lithographic plate.

(Sensitizing Solution 2)
Acid-decomposable compound ② (0.215 g)
Acid generator: 2-(p-methoxynaphthyl)-4,6-bis(trichloromethyl)-s-triazine (0.021 g)
Infrared absorber: cyanine compound B shown below (0.072 g)
Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ② (1.0 g)
Dye: Crystal Violet (0.01 g)
Solvent: propylene glycol monomethyl ether/methyl cellosolve acetate (45 ml/5 ml)

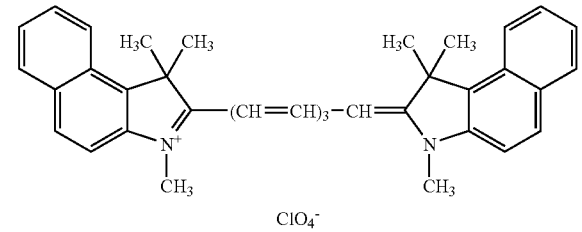

Cyanine compound B

EXAMPLE 3

Using a whirler, the following sensitizing solution 3 was applied onto the same substrate as used in Example 1, so as to give a dry film thickness of 1.8 g/m², and dried at 100° C. for 10 minutes to obtain a lithographic plate.

(Sensitizing Solution 3)
Acid-decomposable compound ③ (0.215 g)
Acid generator: 2-(p-methoxyphenyl)-4,6-bis(trichloromethyl)-s-triazine (0.021 g)
Infrared absorber: cyanine compound B (0.072 g)
Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ① (1.0 g)
Dye: Crystal Violet (0.01 g)
Solvent: propylene glycol monomethyl ether/methyl cellosolve acetate (45 ml/5 ml)

EXAMPLE 4

Using a whirler, the following sensitizing solution 4 was applied onto the same substrate as used in Example 1, so as to give a dry film thickness of 1.8 g/m², and dried at 100° C. for 10 minutes to obtain a lithographic plate.

(Sensitizing Solution 4)
Acid-decomposable compound ④ (0.215 g)
Acid generator: 2-(p-methoxyphenyl)-4,6-bis(trichloromethyl)-s-triazine (0.021 g)
Infrared absorber: cyanine compound B (0.072 g)
Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ② (1.0 g)
Dye: Crystal Violet (0.01 g)
Solvent: propylene glycol monomethyl ether/methyl cellosolve acetate (45 ml/5 ml)

COMPARATIVE EXAMPLE 1

Similarly to Example 1, the following image-forming composition was applied onto the same substrate as used in Example 1, and dried to obtain a lithographic plate.

(Sensitizing Solution 5)

Pyrolyzable compound: diphenyliodonium hexafluorophosphate (0.215 g)

Acid generator: 2-(p-methoxyphenyl)-4,6-bis(trichloromethyl)-s-triazine (0.021 g)

Infrared absorber: cyanine compound A (0.072 g)

Alkali-soluble resins: novolak resin PSF-2803 (manufactured by Gun Ei Chemical Industry Co., Ltd.) (2.0 g) and novolak resin PSF-2807 (manufactured by Gun Ei Chemical Industry Co., Ltd.) (2.15 g)

Dye: Crystal Violet (0.01 g)

Solvent: propylene glycol monomethyl ether/methyl cellosolve acetate (45 ml/5 ml)

COMPARATIVE EXAMPLE 2

Similarly to Example 1, the following image-forming composition was applied onto the same substrate as used in Example 1, and dried to obtain a lithographic plate.

(Sensitizing Solution 6)

Pyrolyzable compound: 5-naphthoquinonediazidesulfonic acid ester of pyrogallol-acetone resin (0.215 g)

Acid generator: 2-(p-methoxyphenyl)-4,6-bis(trichloromethyl)-s-triazine (0.021 g)

Infrared absorber: cyanine compound A (0.072 g)

Alkali-soluble resins: novolak resin PSF-2803 (manufactured by Gun Ei Chemical Industry Co., Ltd.) (2.0 g) and novolak resin PSF-2807 (manufactured by Gun Ei Chemical Industry Co., Ltd.) (2.15 g)

Dye: Crystal Violet (0.01 g)

Solvent: propylene glycol monomethyl ether/methyl cellosolve acetate (45 ml/5 ml)

COMPARATIVE EXAMPLE 3

Similarly to Example 1, the following image-forming composition was applied onto the same substrate as used in Example 1, and dried to obtain a lithographic plate.

(Sensitizing Solution 7)

Control acid-decomposable compound ⑤ (0.215 g)

Acid generator: 2-(p-methoxyphenyl)-4,6-bis(trichloromethyl)-s-triazine (0.021 g)

Infrared absorber: cyanine compound A (0.072 g)

Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ① (1.0 g)

Dye: Crystal Violet (0.01 g)

Solvent: propylene glycol monomethyl ether/methyl cellosolve acetate (45 ml/5 ml)

COMPARATIVE EXAMPLE 4

Similarly to Example 1, the following image-forming composition was applied onto the same substrate as used in Example 1, and dried to obtain a lithographic plate.

(Sensitizing Solution 8)

Control acid-decomposable compound ⑥ (0.215 g)

Acid generator: 2-(p-methoxyphenyl)-4,6-bis(trichloromethyl)-s-triazine (1.021 g)

Infrared absorber: cyanine compound A (0.072 g)

Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ① (1.0 g)

Dye: Crystal Violet (0.01 g)

Solvent: propylene glycol monomethyl ether/methyl cellosolve acetate (45 ml/5 ml)

COMPARATIVE EXAMPLE 5

Similarly to Example 1, the following image-forming composition was applied onto the same substrate as used in Example 1, and dried to obtain a lithographic plate.

(Sensitizing Solution 9)

Control acid-decomposable compound ⑦ (0.215 g)

Acid generator: 2-(p-methoxyphenyl)-4,6-bis(trichloromethyl)-s-triazine (2.021 g)

Infrared absorber: cyanine compound A (0.072 g)

Alkali-soluble resins: novolak resin PSF-2803 (manufactured by Gun Ei Chemical Industry Co., Ltd.) (2.0 g), novolak resin PSF-2807 (manufactured by Gun Ei Chemical Industry Co., Ltd.) (1.15 g) and alkali-soluble acrylic copolymer ① (1.0 g)

Dye: Crystal Violet (0.01 g)

Solvent: propylene glycol monomethyl ether/methyl cellosolve acetate (45 ml/5 ml)

Using a semiconductor laser having a wavelength of 830 nm (Trend Setter 400Q, manufactured by Creo Inc.), 200 lines and 1 to 99% halftone images were formed on each of the aforesaid lithographic plates at various exposure energies. Then, they were developed with an alkaline developing solution at 30° C. for 12 seconds.

| Composition of an alkaline developing solution | |
|---|---|
| JIS No. 3 sodium silicate: | 25 g |
| Potassium hydroxide: | 12 g |
| Amphoteric surface-active agent: | 1 g |
| Water: | 1 kg |

Next, the following evaluations were performed, and the results are shown in Table 1.

Sensitivity was evaluated by inking the non-image area (exposed region) of the printing plate developed with the aforesaid developing solution, and determining the minimum exposure at which no stain was produced in the non-image area.

Latitude of development was evaluated by soaking the exposed printing plate in the aforesaid developing solution and measuring the time required for the disappearance of the image area (unexposed region).

Latitude of development was further evaluated by developing the printing plate with the aforesaid developing solution and measuring the number of treated sheets (treatable area in m$^2$) at which a stain was produced in the non-image area.

Printing durability was evaluated by developing the printing plate with the aforesaid developing solution, using it on a Ryobi 480D printing machine to print images on fine paper with a commercially available ink, and counting the number of copies at which the images became blurred.

TABLE 1

| | Sensitizing solution | Sensitivity (mJ/cm²) | Latitude of development (seconds) | Treatable area (m²) | printing durability |
|---|---|---|---|---|---|
| Example 1 | 1 | 150 | 60 | 2.5 | 50,000 |
| Example 2 | 2 | 150 | 60 | 2.5 | 60,000 |
| Example 3 | 3 | 150 | 60 | 2.5 | 50,000 |
| Example 4 | 4 | 150 | 60 | 2.5 | 55,000 |
| Comparative Example 1 | 5 | 180 | 30 | 1.5 | 45,000 |
| Comparative Example 2 | 6 | 200 | 30 | 1.0 | 45,000 |
| Comparative Example 3*¹ | 7 | — | — | — | — |
| Comparative Example 4*² | 8 | 150 | 5 | — | — |
| Comparative Example 5*² | 9 | 150 | 10 | — | — |

*¹No image formation
*²Poor ink adhesion

As is evident from Table 1, the lithographic plates in accordance with the present invention had high sensitivity to infrared radiation as from a semiconductor laser, great latitude of development, a large treatable area in m², and excellent printing durability. That is, owing to the —O—Si— structure, the acid-decomposable compounds of the present invention decompose rapidly to become soluble in an alkaline developing solution. On the other hand, owing to the addition of a compound of the above general formula (1) or (2), they show high alkali resistance before decomposition. Thus, they are believed to have excellent latitude of development. Moreover, it is considered that, owing to the addition of a compound of the above general formula (1) or (2), the acid-decomposable compounds of the present invention give good ink adhesion and excellent printing durability.

In Comparative Example 3 which corresponds to X¹—H as compared with the general formula (1), no image was formed. Moreover, in Comparative Example 4 which corresponds to X¹—C₃H₇ as compared with the general formula (1), and Comparative Example 5 which corresponds to X¹-ph as compared with the general formula (1), the ink adhesion was poor and the latitude of development was limited.

The invention claimed is:

1. An image-forming composition comprising
(A) a polymeric compound obtained by the addition reaction of a resinous polymer having one or more phenolic hydroxyl group with a silane coupling agent of the following general formula (1) or (2),

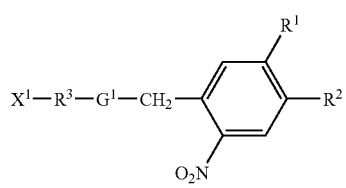
(1)

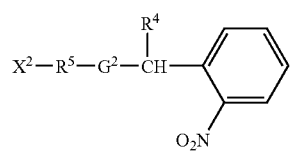
(2)

wherein:
X¹ represents a trimethoxysilyl or triethoxysilyl group;
G¹ represents O or COO;
R¹ and R² each independently represents a hydrogen atom or a methoxy group, with the proviso that both of R¹ and R² are not hydrogen atoms at the same time, or R¹ and R² are combined together to form a ring through an alkylenedioxy group;
R³ represents $(CH_2)_m$, optionally having a hydrocarbon side chain, wherein m is an integer of 3 or greater;
X² represents a trimethoxysilyl, triethoxysilyl, chlorodimethylsilyl, dichloromethylsilyl or trichlorosilyl group;
G² represents O or COO;
R⁴ represents a hydrogen atom or a straight-chain or branched alkyl group; and
R⁵ represents $(CH_2)_n$, optionally having a hydrocarbon side chain, wherein n is an integer of 3 or greater;
(B) an acid generator;
(C) an infrared absorber; an
(D) an alkali-soluble resin;
wherein said polymeric compound comprises at least one compound selected from the group consisting of cresol-formaldehyde resins, resol type phenolic resins, pyrogallol-acetone resin, polyvinylphenol, a copolymer of vinylphenol and styrene, and t-butyl-substituted polyvinylphenol resin.

2. A photosensitive lithographic plate having an image-forming composition applied onto a substrate, the image-forming composition comprising
(A) a polymeric compound obtained by the addition reaction of a resinous polymer having one or more phenolic hydroxyl groups with a silane coupling agent of the following general formula (1) or (2),

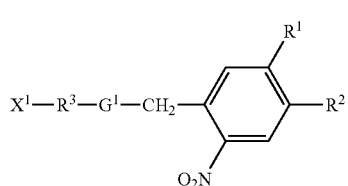
(1)

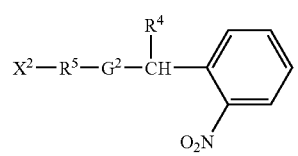
(2)

wherein:
Xᵗ represents a trimethoxysilyl or triethoxysilyl group;
G¹ represents O or COO;
R¹ and R² each independently represents a hydrogen atom or a methoxy group, with the proviso that both of R¹ and R² are not hydrogen atoms at the same time, or R¹ and R² are combined together to form a ring through an alkylenedioxy group;
R³ represents $(CH_2)_m$, optionally having a hydrocarbon side chain, wherein m is an integer of 3 or greater;
X² represents a trimethoxysilyl, triethoxysilyl, chlorodimethylsilyl, dichloromethylsilyl or trichlorosilyl group;
G² represents O or COO;
R⁴ represents a hydrogen atom or a straight-chain or branched alkyl group; and $R^5$ represents $(CH_2)_n$, optionally having a hydrocarbon side chain, wherein n is an integer of 3 or greater;
(B) an acid generator;
(C) an infrared absorber; and
(D) an alkali-soluble resin.

3. A polymeric compound of the following formula (I):

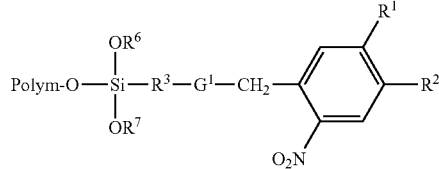

(I)

wherein:
Polym-OH represents a resinous polymer having one or more phenolic hydroxyl groups;
$G^1$ represents O or COO;
$R^1$ and $R^2$ each independently represents a hydrogen atom or a methoxy group, with the proviso that both $R^1$ and $R^2$ are not hydrogen atoms at the same time, or $R^1$ and $R^2$ are combined together to form a ring through an alkylenedioxy group;
$R^3$ represents $(CH_2)_m$, optionally having a hydrocarbon side chain, wherein m is an integer of 3 or greater; and
$R^6$ and $R^7$ each independently represents a hydrogen atom, a methyl group or an ethyl group.

4. A polymeric compound of the following formula (II):

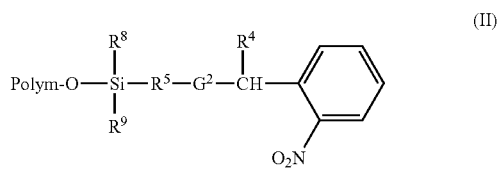

(II)

wherein:
Polym-OH represents a resinous polymer having one or more phenolic hydroxyl groups;
$G^2$ represents O or COO;
$R^4$ represents a hydrogen atom or a straight-chain or branched alkyl group;
$R^5$ represents $(CH_2)_n$, optionally having a hydrocarbon side chain, wherein n is an integer of 3 or greater; and
$R^8$ and $R^9$ each independently represents a methyl group, a hydroxyl group or a chlorine atom.

* * * * *